(12) United States Patent
Chiu

(10) Patent No.: US 8,368,202 B2
(45) Date of Patent: Feb. 5, 2013

(54) SEMICONDUCTOR DEVICE AND SEMICONDUCTOR PACKAGE HAVING THE SAME

(75) Inventor: Chi-Tsung Chiu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 250 days.

(21) Appl. No.: 12/954,229

(22) Filed: Nov. 24, 2010

(65) Prior Publication Data

US 2012/0126417 A1    May 24, 2012

(51) Int. Cl.
 *H01L 23/04* (2006.01)
(52) U.S. Cl. .................. 257/698; 257/E23.021
(58) Field of Classification Search .................. 257/698, 257/776, 779, 784, E23.021
See application file for complete search history.

(56) References Cited

U.S. PATENT DOCUMENTS

| | | | |
|---|---|---|---|
| 6,064,114 A * | 5/2000 | Higgins, III | .................. 257/698 |
| 2007/0145518 A1 | 6/2007 | Mihara | |
| 2009/0146297 A1 | 6/2009 | Badakere et al. | |
| 2009/0200662 A1 | 8/2009 | Ng et al. | |

OTHER PUBLICATIONS

SIPO Office Action dated Jun. 5, 2012, with English translation, for Chinese Patent Application No. 201110100055.6 (5 pages).

* cited by examiner

*Primary Examiner* — Quoc Hoang
(74) *Attorney, Agent, or Firm* — McCracken & Frank LLC

(57) ABSTRACT

The present invention relates to a semiconductor device and a semiconductor package having the same. The semiconductor device includes a semiconductor substrate, a backside dielectric layer, a plurality of first backside under ball metal (UBM) pads and a first backside UBM plane. The backside dielectric layer is disposed adjacent to a backside surface of the semiconductor substrate. The first backside UBM pads are disposed on the backside dielectric layer. The first backside UBM plane is disposed on the backside dielectric layer, and has a plurality of through holes. The first backside UBM pads are located within the through holes, and a gap is between the first backside UBM plane and the first backside UBM pads. Whereby, the cost for forming the first backside UBM pads and the first backside UBM plane is relatively low.

19 Claims, 10 Drawing Sheets

SEMICONDUCTOR DEVICE AND SEMICONDUCTOR PACKAGE HAVING THE SAME

BACKGROUND OF THE INVENTION

1. Field of the Invention

The present invention relates to a semiconductor device and a semiconductor package having the same, and more particularly to a semiconductor device having an UBM plane, and a semiconductor package having the same.

2. Description of the Related Art

In a conventional semiconductor device (e.g. a die or an interposer), at least one ground plane or power plane is formed on a redistribution layer (RDL) that is embedded in a plurality of dielectric layers on the front surface or the backside surface of a semiconductor substrate. The disadvantage of the conventional semiconductor device is that the cost for forming the ground plane or the power plane is relatively high.

SUMMARY OF THE INVENTION

The present invention is directed to a semiconductor device, which comprises a semiconductor substrate, a plurality of first conductive vias, at least one second conductive via, a backside dielectric layer, a plurality of first backside under ball metal (UBM) pads and a first backside UBM plane. The semiconductor substrate has a front surface and a backside surface. The first conductive vias are disposed in the semiconductor substrate, and each of the first conductive vias is surrounded by a first liner. The second conductive via is disposed in the semiconductor substrate and surrounded by a second liner. The backside dielectric layer is disposed adjacent to the backside surface. The first backside UBM pads are disposed on the backside dielectric layer and electrically connected to the first conductive vias. The first backside UBM plane is disposed on the backside dielectric layer and electrically connected to the at least one second conductive via. The first backside UBM plane has a plurality of through holes, the first backside UBM pads are located within the through holes, and a gap is between the first backside UBM plane and the first backside UBM pads.

In the present invention, the first backside UBM pads and the first backside UBM plane are on the outmost layer of the semiconductor device. Therefore, the cost for forming the first backside UBM pads and the first backside UBM plane is relatively low. In addition, the first backside UBM plane may be a ground plane or a power plane, whereby it will maintain the electrical performance in terms of signal integrity and power integrity.

The present invention is also directed to a semiconductor package, which comprises the above-mentioned semiconductor device, a top die and an underfill. The top die is disposed on the semiconductor device and has a plurality of top connection elements on a surface thereof, wherein the top connection elements are respectively connected to the first backside UBM pads and at least one of the top connection elements is electrically connected to the first backside UBM plane. The underfill is disposed between the top die and the semiconductor device for protecting the top connection elements.

DETAILED DESCRIPTION OF THE INVENTION

Figure 1:
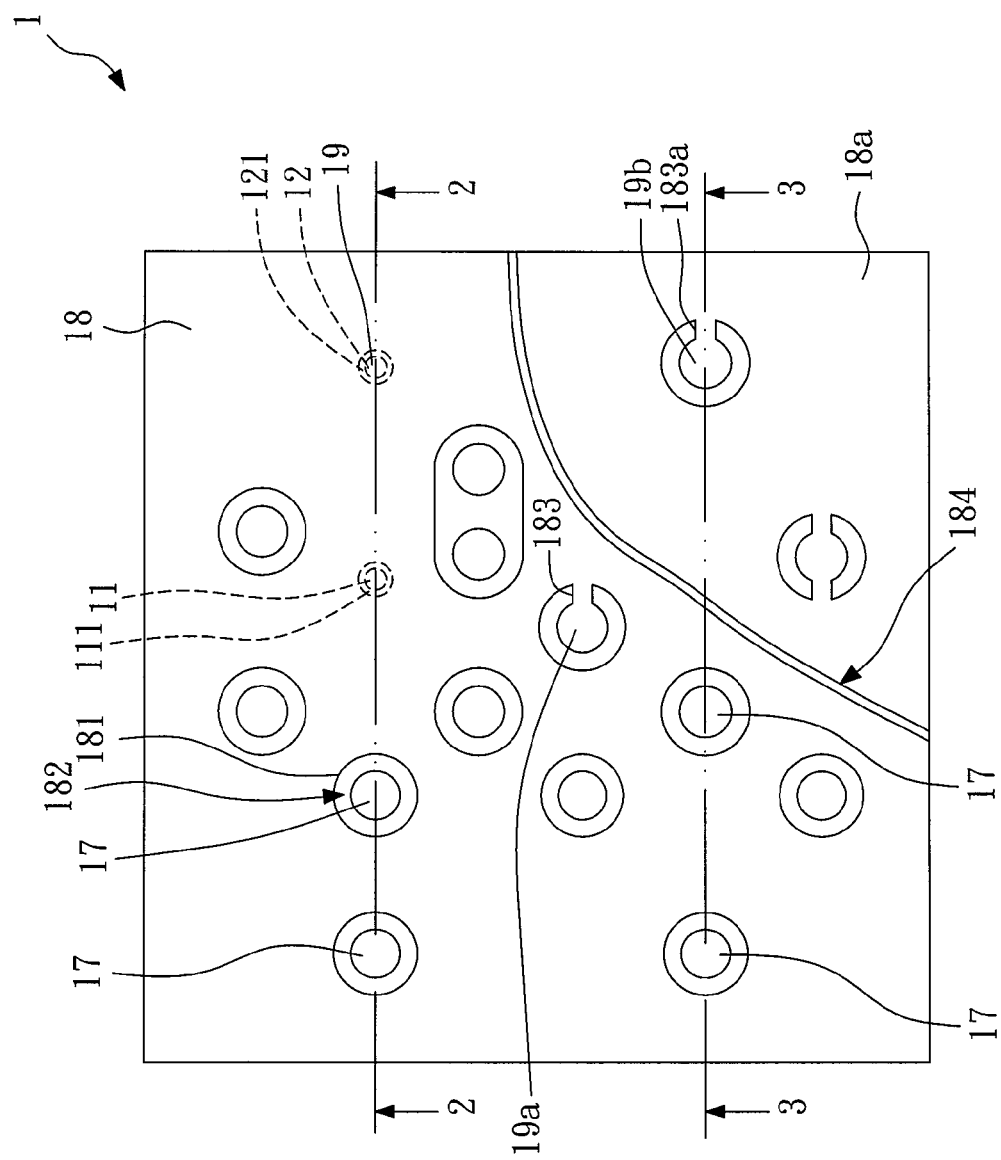
FIG. 1 shows a top view of the semiconductor device according to a first embodiment of the present invention.
Figure 2:
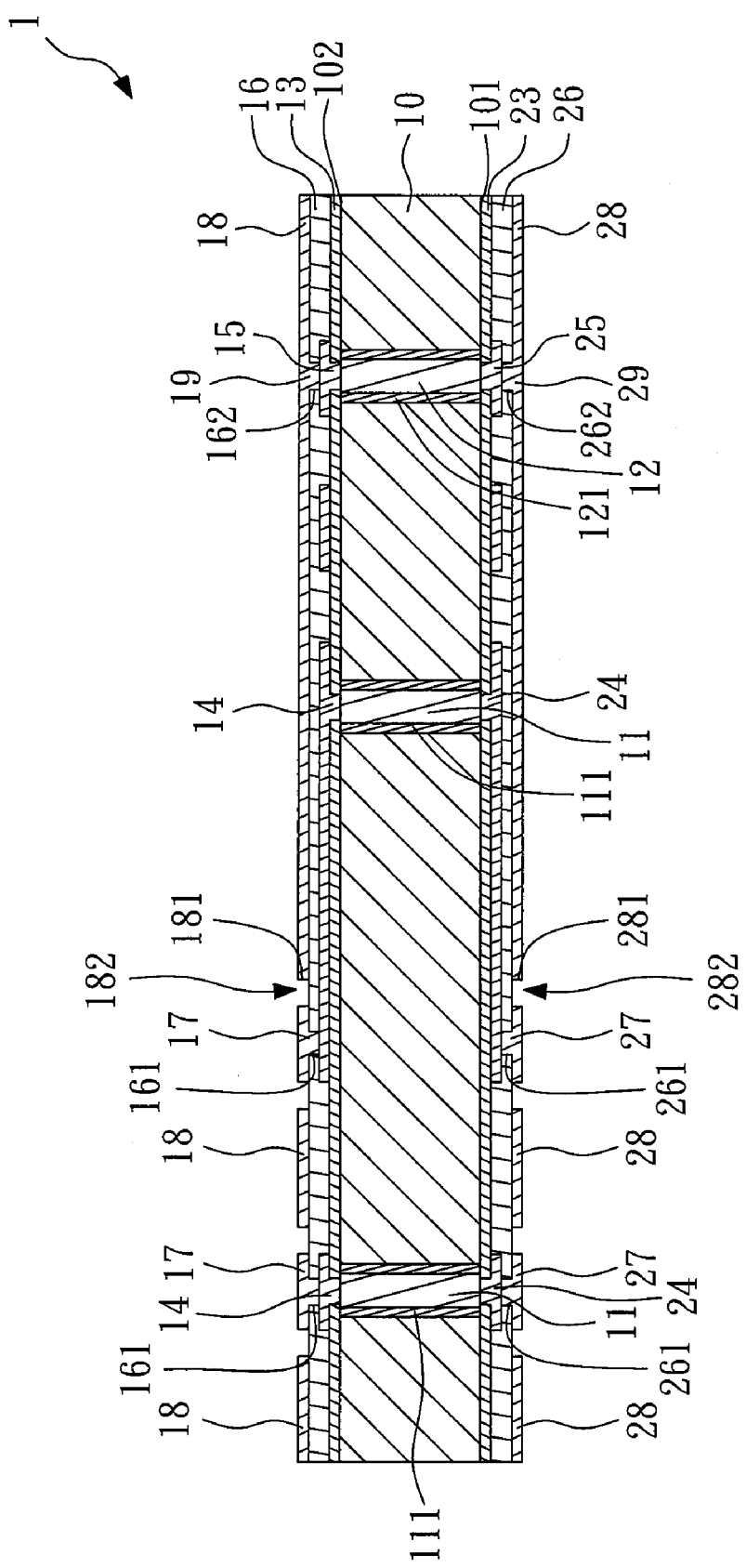
FIG. 2 shows a cross-sectional view taken along the line 2-2 of FIG. 1.

FIG. 1 shows a top view of the semiconductor device according to a first embodiment of the present invention. FIG. 2 shows a cross-sectional view taken along the line 2-2 of FIG. 1. The semiconductor device 1 comprises a semiconductor substrate 10, a plurality of first conductive vias 11, at least one second conductive via 12, a backside passivation 13, a plurality of first backside redistribution layers (RDLs) 14, at least one second backside RDL 15, a backside dielectric layer 16, a plurality of first backside under ball metal (UBM) pads 17 and a first backside UBM plane 18.

The semiconductor substrate 10 has a front surface 101 and a backside surface 102. The first conductive vias 11 are disposed in the semiconductor substrate 10, and each of the first conductive vias 11 is surrounded by a first liner 111. The second conductive via 12 is disposed in the semiconductor substrate 10 and surrounded by a second liner 121. In the embodiment, the top surfaces of the first conductive vias 11, the first liners 111, the second conductive via 12 and the second liner 121 are substantially coplanar with the backside surface 102. Preferably, the first liners 111 and the second liner 121 comprise one or more layers of SiN, an oxide, a polymer, or the like, and the first conductive vias 11 and the second conductive via 12 comprise copper, tungsten, aluminum, silver, and combinations thereof, or the like. Other materials, including conductive diffusion barrier layers, such as TaN, Ta, TiN, Ti, CoW, or the like, may also be used.

The backside passivation 13 (such as a photoresist layer (e.g., BCB) or a non-conductive polymer) is disposed on the backside surface 102 of the semiconductor substrate 10 and has a plurality of openings to expose the ends of the first conductive vias 11 and the second conductive via 12. The first backside RDLs 14 are disposed in the openings of the backside passivation 13 and on part of the backside passivation 13 so as to contact and electrically connect the first conductive vias 11. The second backside RDL 15 is disposed in the openings of the backside passivation 13 and on part of the backside passivation 13 so as to contact and electrically connect the second conductive via 12. The first backside RDLs 14 and the second backside RDL 15 are the same Cu layer that is formed by plating.

The backside dielectric layer 16 is disposed adjacent to the backside surface 102. In the embodiment, the backside dielectric layer 16 is disposed over the first backside RDLs 14, the second backside RDL 15 and the backside passivation 13. The backside dielectric layer 16 has a plurality of first openings 161 and at least one second opening 162 to expose parts of the first backside RDLs 14 and the second backside RDL 15, respectively.

The first backside UBM pads 17 are disposed in the first openings 161 and on part of the backside dielectric layer 16, and are electrically connected to the first conductive vias 11. The first backside UBM plane 18 is disposed on the backside dielectric layer 16 and is electrically connected to the at least one second conductive via 12. The area of the first backside UBM plane 18 is larger than that of each of the first backside UBM pads 17. The first backside UBM plane 18 is exposed to the air and has a plurality of through holes 181. The first backside UBM pads 17 are located within the through holes 181. A gap 182 is between the first backside UBM plane 18 and the first backside UBM pads 17. That is, the first backside UBM plane 18 does not contact the first backside UBM pads 17.

In the embodiment, the semiconductor device 1 further comprises at least one second backside UBM pad 19. The second backside UBM pad 19 is disposed in the second opening 162 and on the backside dielectric layer 16, and is electrically connected to the second conductive via 12. The first backside UBM plane 18 is electrically connected to the second conductive via 12 through the second backside UBM pad 19. In the embodiment, the semiconductor device 1 further comprises at least one trace 183 that connects the second backside UBM pad 19a to the first backside UBM plane 18.

In the embodiment, the first backside UBM pads 17, the second backside UBM pad 19 and the first backside UBM plane 18 are formed by selectively patterning an UBM layer comprising a Cu layer, a Ni layer, a Pd layer and an Au layer. However, in other embodiment, the UBM layer comprises a Cu layer, a Ni layer and a Sn/Ag alloy layer. In still other embodiment, the UBM layer may be made of Al/Ni/Au, Al/NiV/Cu, Cu/Ni/Au, Cu/Ni/Pd, Cu/Cr/Al or Ti/Ai/Ti/NiV.

In the embodiment, the structure on the backside surface 102 of the semiconductor substrate 10 is the same as that on the front surface 101 of the semiconductor substrate 10. The semiconductor device 1 further comprises a front passivation 23, a plurality of first front RDLs 24, at least one second front RDL 25, a front dielectric layer 26, a plurality of first front UBM pads 27 and a first front UBM plane 28.

The front passivation 23 is disposed on the front surface 101 of the semiconductor substrate 10 and has a plurality of openings to expose the ends of the first conductive vias 11 and the second conductive via 12.

The first front RDLs 24 are disposed in the openings of the front passivation 23 and on part of the front passivation 23 so as to contact and electrically connect the first conductive vias 11. The second front RDL 25 is disposed in the openings of the front passivation 23 and on part of the front passivation 23 so as to contact and electrically connect the second conductive via 12.

The front dielectric layer 26 is disposed adjacent to the front surface 101. In the embodiment, the front dielectric layer 26 is disposed over the first front RDLs 24, the second front RDL 25 and the front passivation 23. The front dielectric layer 26 has a plurality of first openings 261 and at least one second opening 262 to expose parts of the first front RDLs 24 and the second front RDL 25, respectively.

The first front UBM pads 27 are disposed in the first openings 261 and on part of the front dielectric layer 26, and are electrically connected to the first conductive vias 11. The first front UBM plane 28 is disposed on the front dielectric layer 26 and is electrically connected to the at least one second conductive via 12. The first front UBM plane 28 is exposed to the air and has a plurality of through holes 281. The first front UBM pads 27 are located within the through holes 281. A gap 282 is between the first front UBM plane 28 and the first front UBM pads 27. That is, the first front UBM plane 28 does not contact the first front UBM pads 27.

In the embodiment, the semiconductor device 1 further comprises at least one second front UBM pad 29. The second front UBM pad 29 is disposed in the second opening 262 and on the front dielectric layer 26, and is electrically connected to the second conductive via 12. The first front UBM plane 28 is electrically connected to the second conductive via 12 through the second front UBM pad 29.

Figure 3:
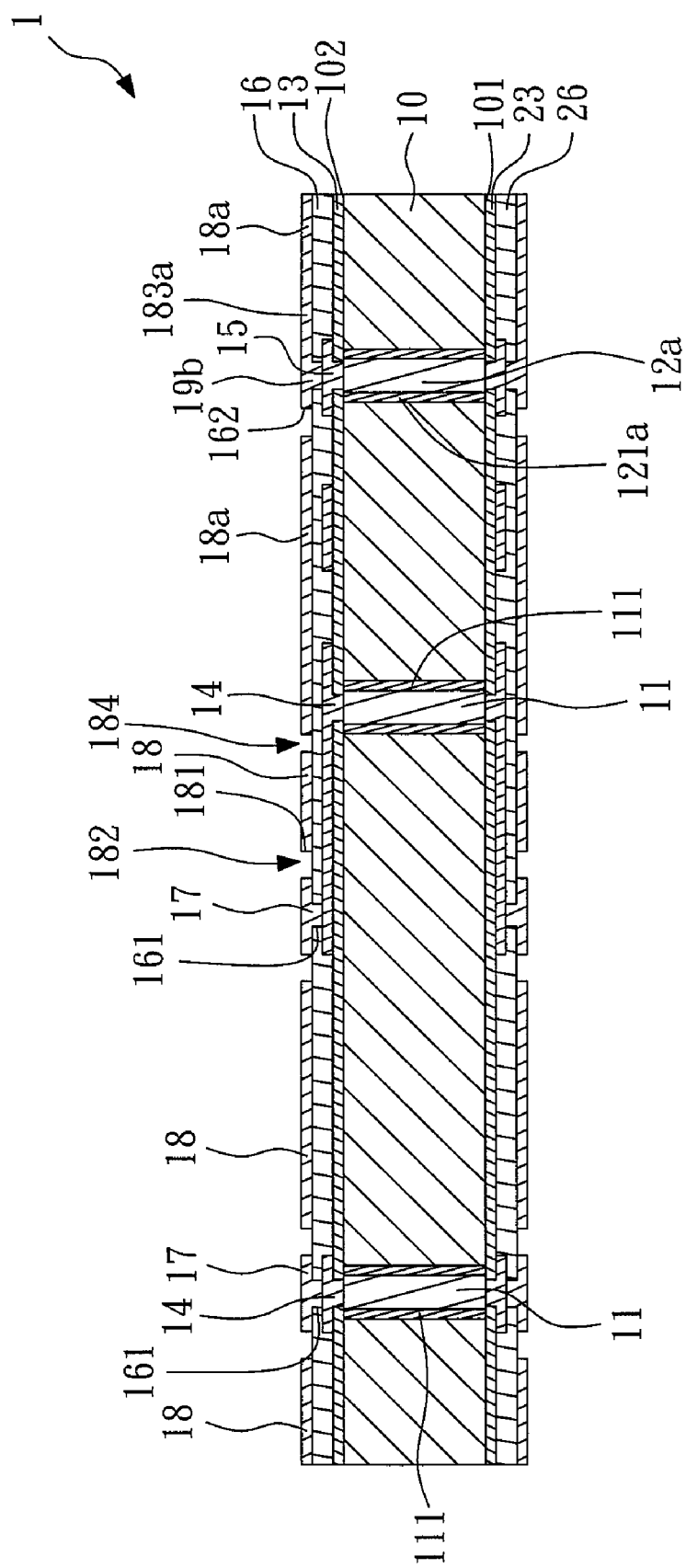
FIG. 3 shows a cross-sectional view taken along the line 3-3 of FIG. 1.

FIG. 3 shows a cross-sectional view taken along the line 3-3 of FIG. 1. In the embodiment, the semiconductor device 1 further comprises at least one third conductive via 12a and a second backside UBM plane 18a. The third conductive via 12a is disposed in the semiconductor substrate 10 and surrounded by a third liner 121a. The second backside UBM plane 18a is disposed on the backside dielectric layer 16 and electrically connected to the third conductive via 12a. The second backside UBM plane 18a is exposed to the air and does not connect the first backside UBM plane 18. A slit 184 is between the second backside UBM plane 18a and the first backside UBM plane 18.

In the embodiment, the second backside UBM pad 19b is disposed in the second opening 162 and on the backside dielectric layer 16, and is electrically connected to the second conductive via 12a. The second backside UBM plane 18a is electrically connected to the second conductive via 12a through the second backside UBM pad 19b and the second backside RDL 15. In the embodiment, the semiconductor device 1 further comprises at least one trace 183a that connects the second backside UBM 19b to the second backside UBM plane 18a.

In the embodiment, the first backside UBM pads 17, the first backside UBM plane 18, the second backside UBM pads 19, 19a, 19b, the second backside UBM plane 18a and the traces 183, 183a are on the outmost layer of the semiconductor device 1, and they are formed by a UBM process. Therefore, the cost for forming the first backside UBM pads 17, the first backside UBM plane 18, the second backside UBM pads 19, 19a, 19b, the second backside UBM plane 18a and the traces 183, 183a is relatively low. In addition, one of the first backside UBM plane 18 and the second backside UBM plane 18a may be a ground plane or a power plane. Alternatively, the first backside UBM plane 18 and the second backside UBM plane 18a may be both ground planes or both power planes. Since the first backside UBM plane 18 and the second backside UBM plane 18a are disposed on the outmost layer, they will maintain the electrical performance in terms of signal integrity and power integrity.

Figure 4:
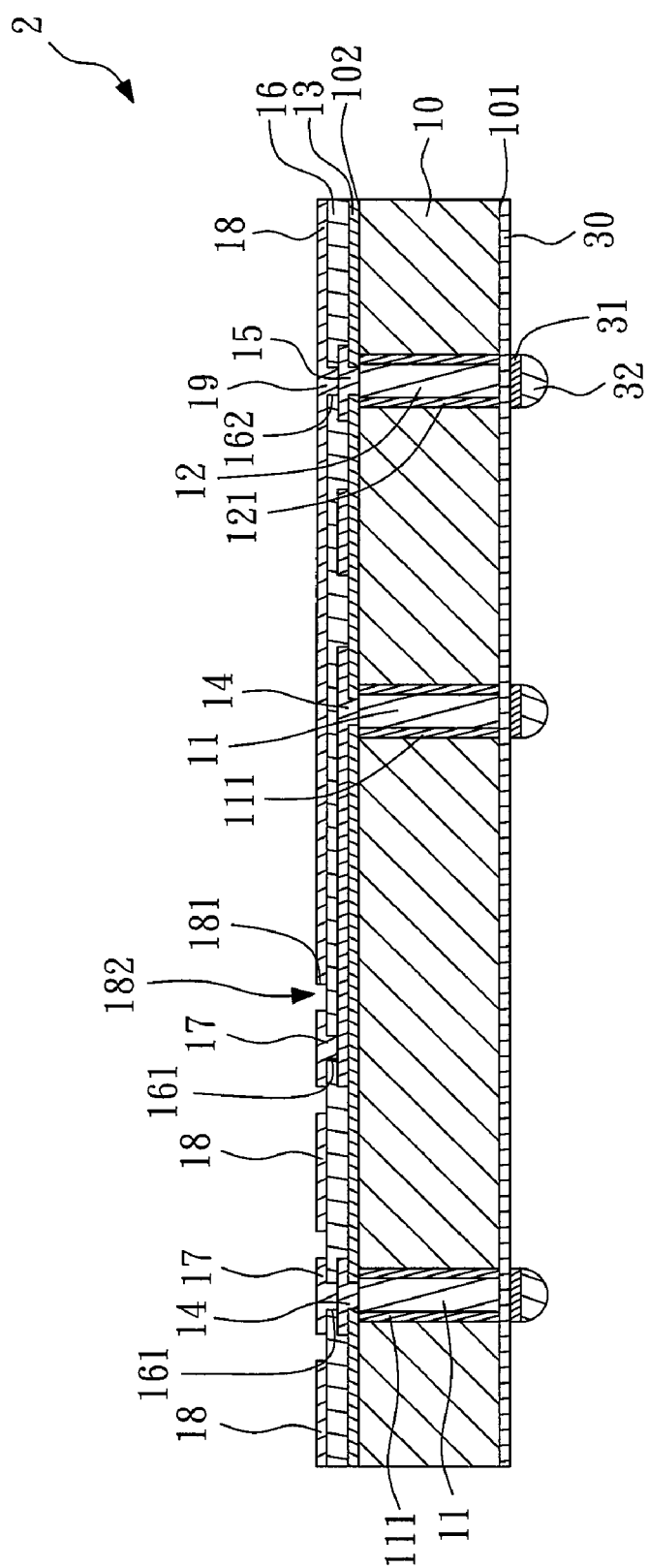
FIG. 4 shows a cross-sectional view of the semiconductor device according to a second embodiment of the present invention.

FIG. 4 shows a cross-sectional view of the semiconductor device according to a second embodiment of the present invention. The semiconductor device 2 according to the second embodiment is substantially the same as the semiconductor device 1 (FIGS. 1 to 3) according to the first embodiment except the structure on the front surface 101 of the semiconductor substrate 10 as described below. The semiconductor device 2 further comprises one or more wiring layers 30, a plurality of bonding pads 31 and a plurality of external connection elements 32 (such as Cu pillars or solder bumps). The one or more wiring layers 30 are disposed on the front surface 101 of the semiconductor substrate 10. The wiring layers 30 comprise at least one dielectric layer and at least one wire. The wire is disposed in the dielectric layer. The wire may be formed of copper, copper alloys or other conductive metal, and may be formed using the well-known damascene processes. Further, the wiring layers 30 may include commonly known inter-layer dielectric (ILD) and inter-metal dielectrics (IMDs).

The bonding pads 31 are disposed on the one or more wiring layers 30 and electrically connected to the first conductive vias 11 and the second conductive via 12 respectively. The external connection elements 32 are respectively disposed on the bonding pads 31. It could be understood that the external connection element 32 is not an essential aspect of the present invention. If the external connection elements 32 are skipped, the bonding pads 31 are exposed for making external connection.

Figure 5:
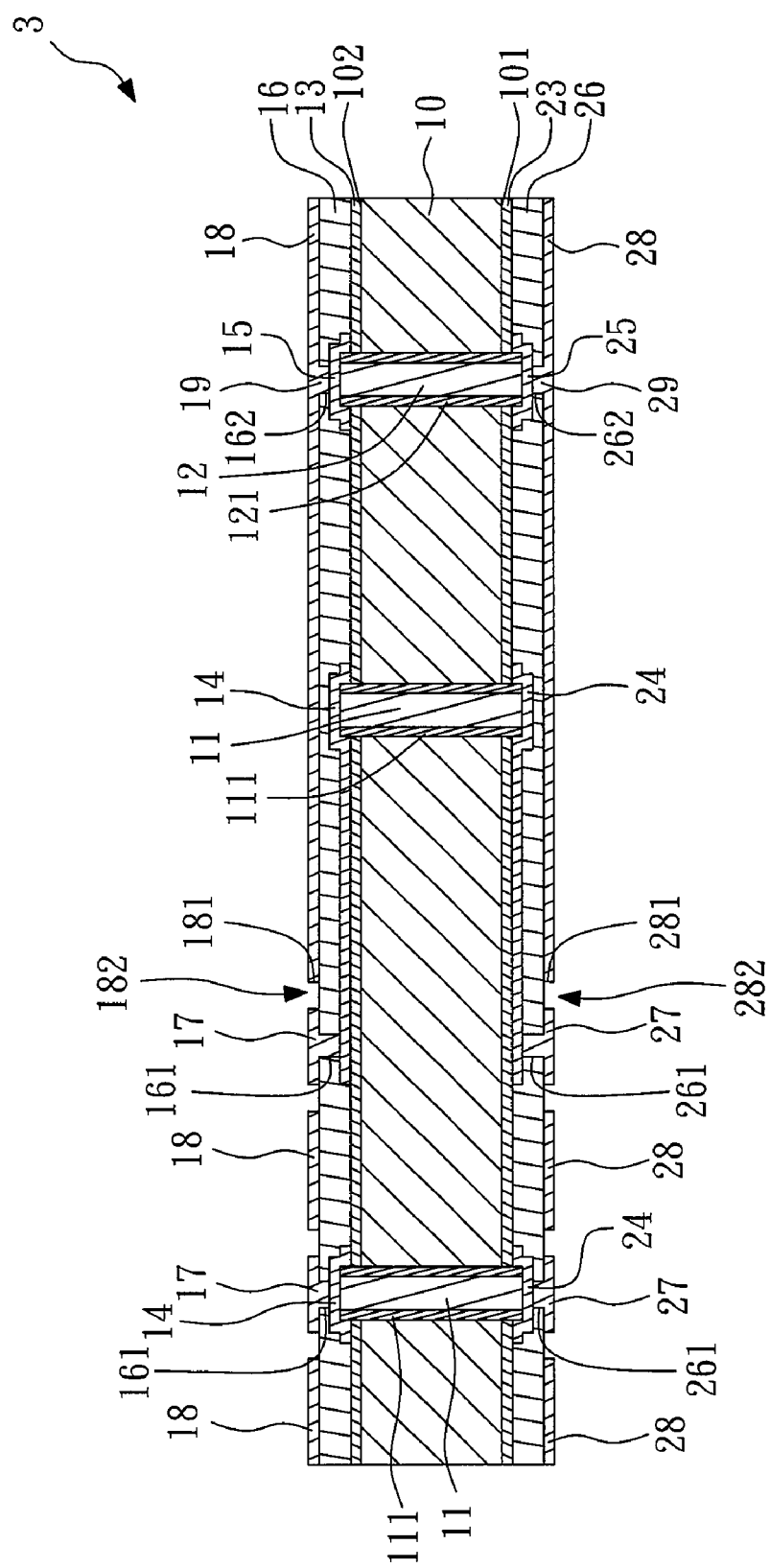
FIG. 5 shows a cross-sectional view of the semiconductor device according to a third embodiment of the present invention.

FIG. 5 shows a cross-sectional view of the semiconductor device according to a third embodiment of the present invention. The semiconductor device 3 according to the third embodiment is substantially the same as the semiconductor device 1 (FIGS. 1 to 3) according to the first embodiment except the structure of the first conductive vias 11 and the second conductive via 12. In the semiconductor device 3, the first conductive vias 11, the first liner 111, the second conductive via 12 and the second liner 121 protrude from the backside surface 102 and the backside passivation 13. Similarly, the first conductive vias 11, the first liner 111, the second conductive via 12 and the second liner 121 protrude from the front surface 101 and the front passivation 23.

Figure 6:
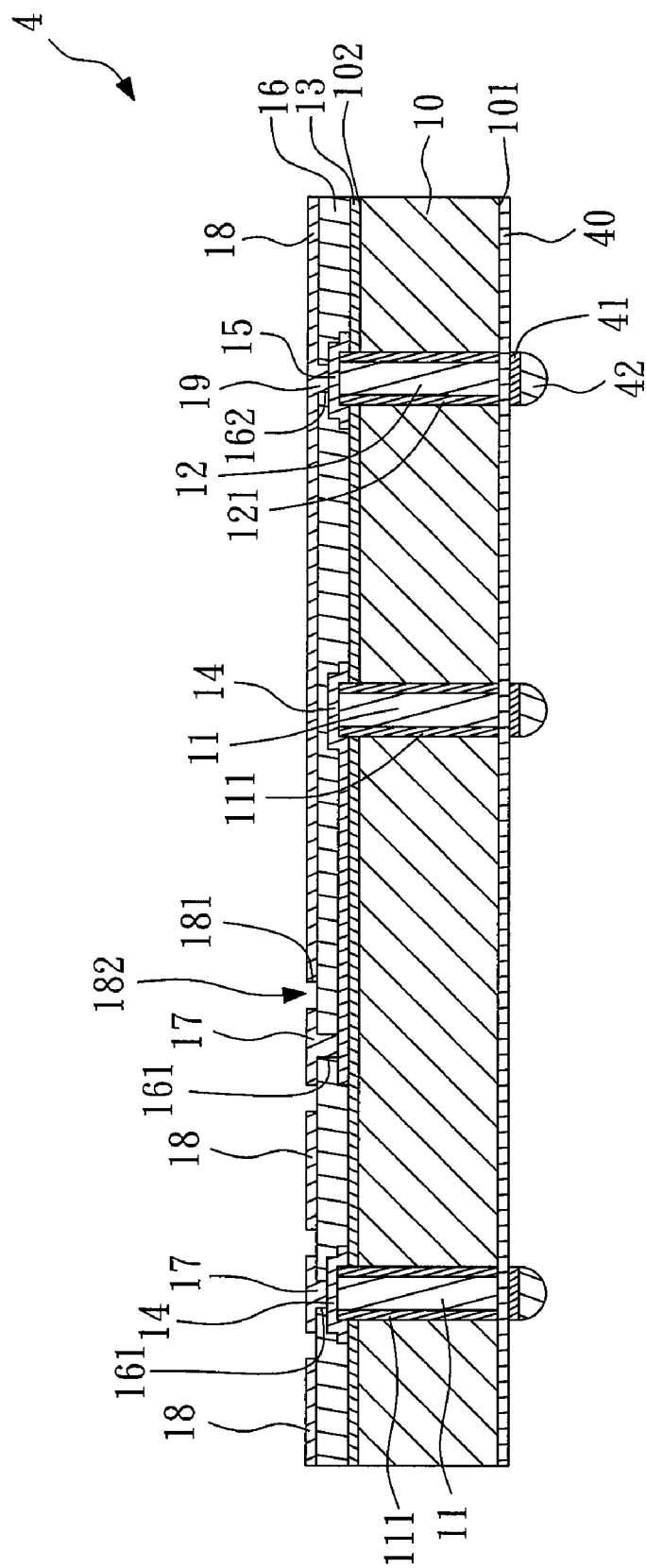
FIG. 6 shows a cross-sectional view of the semiconductor device according to a fourth embodiment of the present invention.

FIG. 6 shows a cross-sectional view of the semiconductor device according to a fourth embodiment of the present invention. The semiconductor device 4 according to the fourth embodiment is substantially the same as the semiconductor device 3 (FIG. 5) according to the third embodiment except the structure on the front surface 101 of the semiconductor substrate 10 as described below. The semiconductor device 4 further comprises one or more wiring layers 40, a plurality of bonding pads 41 and a plurality of external connection elements 42 (such as Cu pillars or solder bumps). The one or more wiring layers 40 are disposed on the front surface 101 of the semiconductor substrate 10. The bonding pads 41 are disposed on the one or more wiring layers 40 and electrically connected to the first conductive vias 11 and the second conductive via 12 respectively. The external connection elements 42 are respectively disposed on the bonding pads 41.

Figure 7:
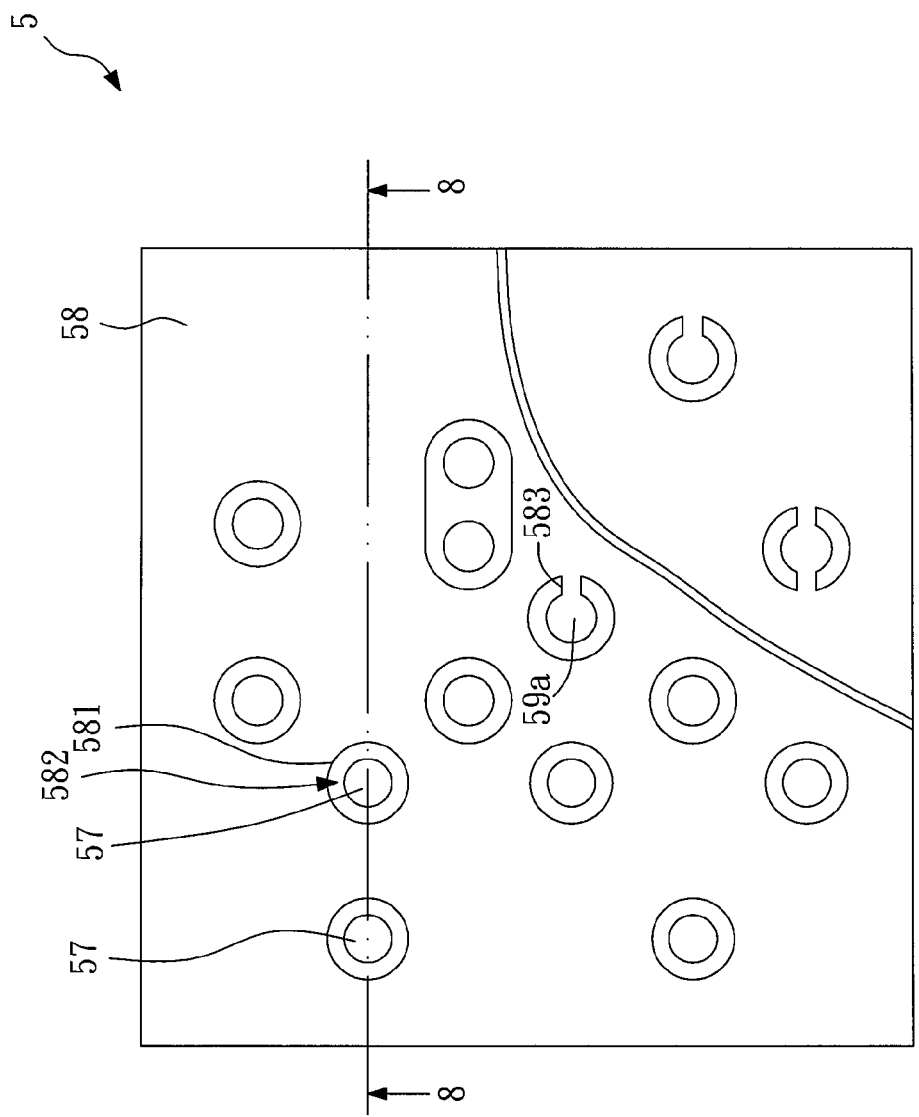
FIG. 7 shows a top view of the semiconductor device according to a fifth embodiment of the present invention.
Figure 8:
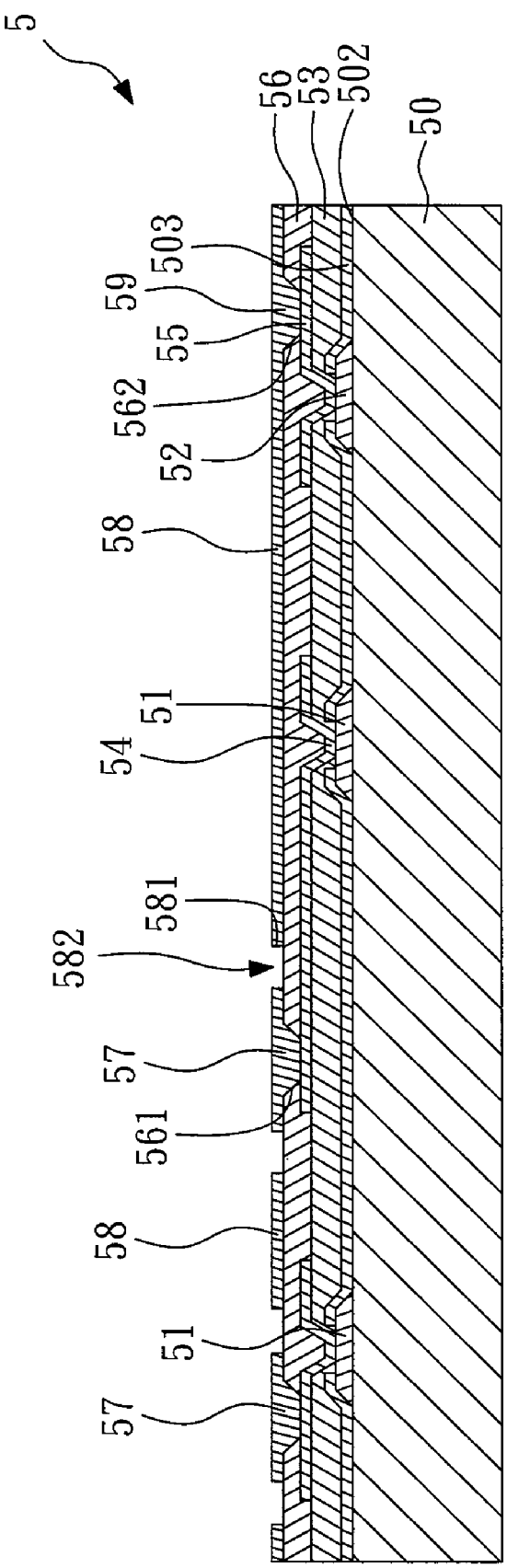
FIG. 8 shows a cross-sectional view taken along the line 8-8 of FIG. 7.

FIG. 7 shows a top view of the semiconductor device according to a fifth embodiment of the present invention. FIG. 8 shows a cross-sectional view taken along the line 8-8 of FIG. 7. The semiconductor device 5 according to the fifth embodiment is substantially the same as the semiconductor device 1 (FIGS. 1 to 3) according to the first embodiment except that the semiconductor device 5 does not comprises the first conductive vias 11 and the second conductive via 12, and the semiconductor device 5 is an active chip.

The semiconductor device 5 comprises a semiconductor substrate 50, a plurality of signal bonding pads 51, at least one power or ground bonding pad 52, an insulation layer 503, a passivation 53, a plurality of first RDLs 54, at least one second RDL 55, a dielectric layer 56, a plurality of first backside UBM pads 57 and a first UBM plane 58.

The semiconductor substrate 50 has a surface 502 (active surface). The signal bonding pads 51 and the power or ground bonding pad 52 are disposed adjacent to the surface 502 of the semiconductor substrate 50.

The insulation layer 503 is disposed on the surface 502 of the semiconductor substrate 50 and has a plurality of openings to expose the signal bonding pads 51 and the power or ground bonding pad 52. The passivation 53 is disposed on the insulation layer 503 and has a plurality of openings to expose the signal bonding pads 51 and the power or ground bonding pad 52. The first backside RDLs 54 are disposed in the openings of the passivation 53 and on part of the passivation 53 so as to contact and electrically connect the signal bonding pads 51. The second RDL 55 is disposed in the openings of the passivation 53 and on part of the passivation 53 so as to contact and electrically connect the power or ground bonding pad 52.

The dielectric layer 56 is disposed adjacent to the surface 502. In the embodiment, the dielectric layer 56 is disposed over the first RDLs 54, the second RDL 55 and the passivation 53. The dielectric layer 56 has a plurality of first openings 561 and at least one second opening 562 to expose parts of the first RDLs 54 and the second RDL 55, respectively.

The first UBM pads 57 are disposed in the first openings 561 and on part of the dielectric layer 56, and are electrically connected to the signal bonding pads 51. The first UBM plane 58 is disposed on the dielectric layer 56 and is electrically connected to the power or ground bonding pad 52. The area of the first UBM plane 58 is larger than that of each of the first UBM pads 57. The first UBM plane 58 is exposed to the air and has a plurality of through holes 581. The first UBM pads 57 are located within the through holes 581. A gap 582 is between the first UBM plane 58 and the first UBM pads 57. That is, the first UBM plane 58 does not contact the first UBM pads 57.

In the embodiment, the semiconductor device 5 further comprises at least one second UBM 59 pad. The second UBM 59 pad is disposed in the second opening 562 and on the dielectric layer 56, and is electrically connected to the power or ground bonding pad 52. The first UBM plane 58 is electrically connected to the power or ground bonding pad 52 through the second UBM 59 pad.

In the embodiment, the semiconductor device 5 further comprises at least one trace 583 that connects the second UBM pad 59a to the first UBM plane 58.

Figure 9:
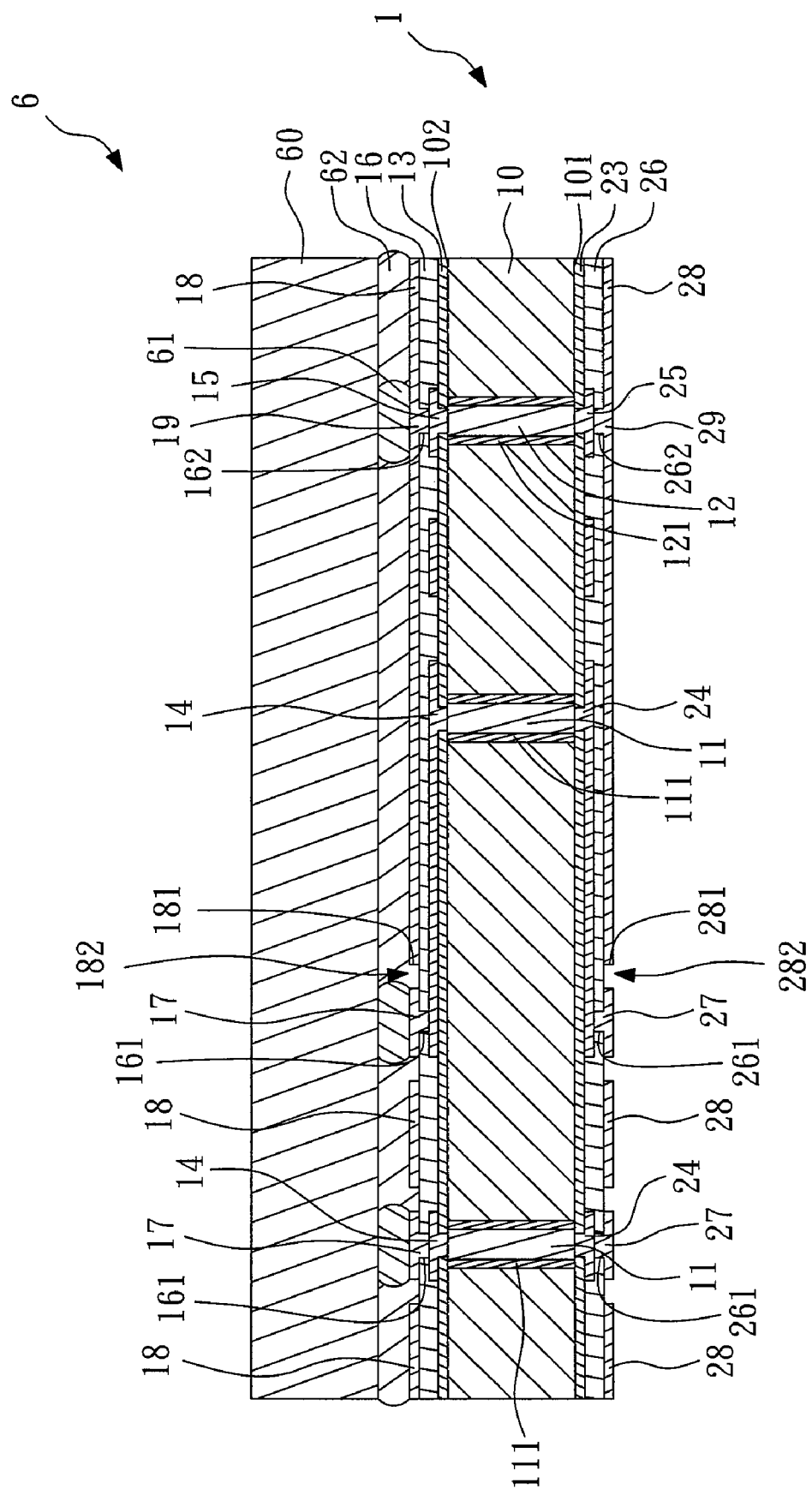
FIG. 9 shows a cross-sectional view of the semiconductor package according to a sixth embodiment of the present invention.

FIG. 9 shows a cross-sectional view of the semiconductor package according to a sixth embodiment of the present invention. The semiconductor package 6 comprises the semiconductor device 1, a top die 60 and an underfill 62. The semiconductor device 1 is the same as the semiconductor device 1 (FIGS. 1-3) according to the first embodiment, and comprises the semiconductor substrate 10, the first conductive vias 11, the second conductive via 12, the backside passivation 13, the first backside RDLs 14, the second backside RDL 15, the backside dielectric layer 16, the first backside UBM pads 17 and the first backside UBM plane 18.

The top die 60 is disposed on the semiconductor device 1 and has a plurality of top connection elements 61 on a surface (bottom surface) thereof. The top connection elements 61 (e.g., solder balls) are respectively connected to the first backside UBM pads 17 and at least one of the top connection elements 61 is electrically connected to the first backside UBM plane 18. In the embodiment, at least one of the top connection elements 61 contacts the second backside UBM pad 19. The underfill 62 is disposed between the top die 60 and the semiconductor device 1 for protecting the top connection elements 61. It is to be noted that the semiconductor device 1 may be replaced by the semiconductor devices 2 (FIG. 4), 3 (FIG. 5), 4 (FIG. 6).

Figure 10:
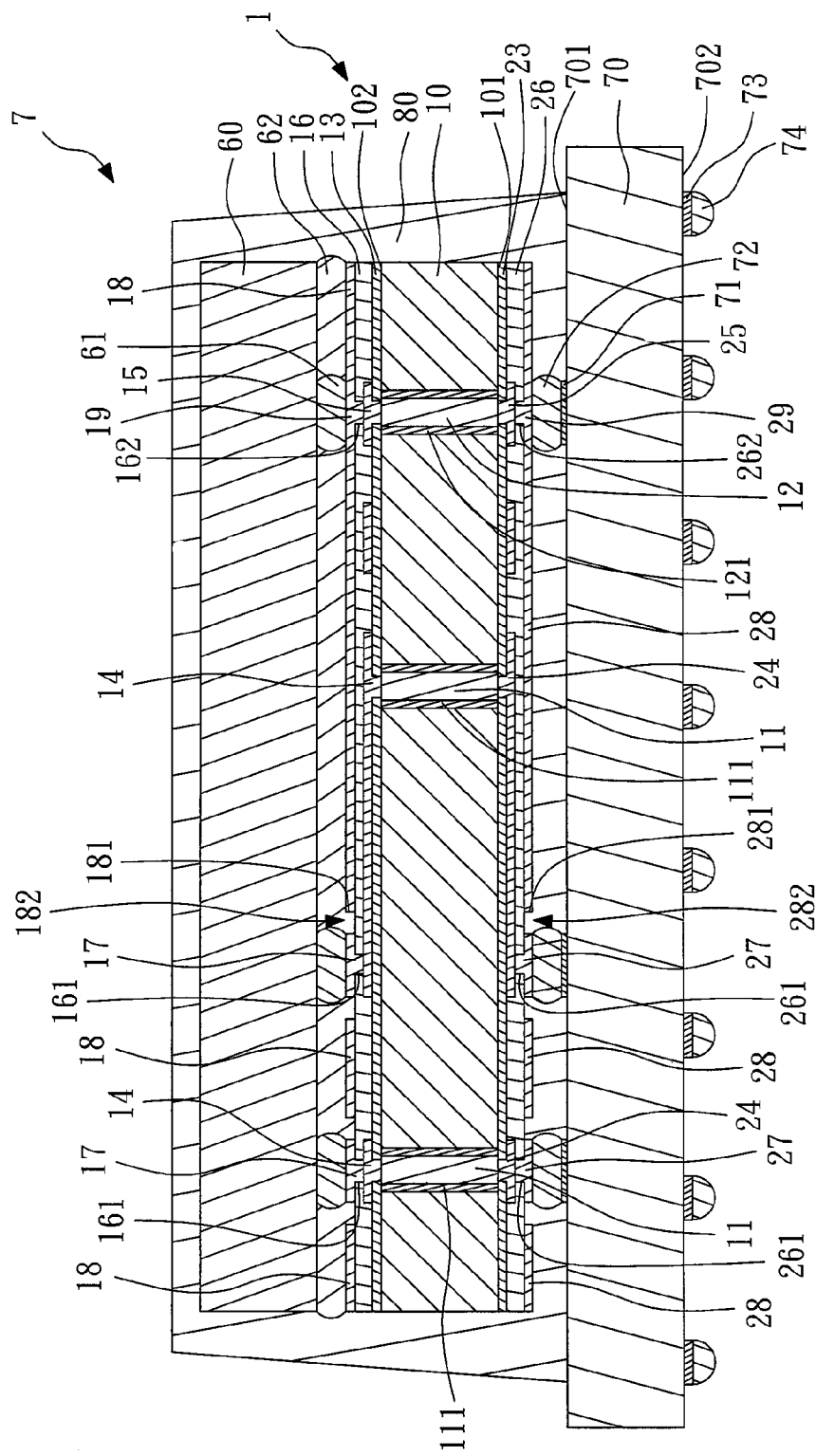
FIG. 10 shows a cross-sectional view of the semiconductor package according to a seventh embodiment of the present invention.

FIG. 10 shows a cross-sectional view of the semiconductor package according to a seventh embodiment of the present invention. The semiconductor package 7 comprises the semiconductor device 1, the top die 60, the underfill 62, a bottom substrate 70, a plurality of bottom connection elements 72 and a molding compound 80. The semiconductor device 1, the top die 60 and the underfill 62 are the same as the semiconductor package 6 (FIG. 9) according to the sixth embodiment. The bottom substrate 70 has a top surface 701, a bottom surface 702, a plurality of top pads 71, a plurality of the bottom pads 73 and solder balls 74. The top pads 71 are disposed on the top surface 701, and the bottom pads 73 are disposed on the bottom surface 702. The bottom connection elements 72 connect the top pads 71 and the first front UBM pads 27 and the first front UBM plane 28 for connecting the bottom substrate 70 and the semiconductor device 1. In the embodiment, at least one of the bottom connection elements 72 contacts the second front UBM pad 29. The molding compound 80 encapsulates the bottom substrate 70, the semiconductor device 1 and the top die 60. It is to be noted that the semiconductor device 1 may be replaced by the semiconductor devices 2 (FIG. 4), 3 (FIG. 5), 4 (FIG. 6). The solder balls 74 are disposed on the bottom pads 73

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor device, comprising:
a semiconductor substrate having a front surface and a backside surface;
a plurality of first conductive vias disposed in the semiconductor substrate, each of the first conductive vias being surrounded by a first liner;
at least one second conductive via disposed in the semiconductor substrate and surrounded by a second liner;
a backside dielectric layer disposed adjacent to the backside surface;
a plurality of first backside under ball metal (UBM) pads disposed on the backside dielectric layer and electrically connected to the first conductive vias; and
a first backside UBM plane disposed on the backside dielectric layer and electrically connected to the at least one second conductive via, wherein the first backside UBM plane has a plurality of through holes, the first backside UBM pads are located within the through holes, and a gap is between the first backside UBM plane and the first backside UBM pads.

2. The semiconductor device as claimed in claim 1, further comprising:
a backside passivation disposed on the backside surface of the semiconductor substrate and exposing ends of the first conductive vias and the second conductive via;
a plurality of first backside redistribution layers (RDLs) disposed on the backside passivation and electrically connected to the first conductive vias;
at least one second backside RDL disposed on the backside passivation and electrically connected to the at least one second conductive via, wherein the backside dielectric layer is disposed over the first backside RDLs, the second backside RDL and the backside passivation, and the backside dielectric layer has a plurality of first openings and at least one second opening to expose parts of the first backside RDLs and the second backside RDL, respectively, the first backside UBM pads are disposed in the first openings;
at least one second backside UBM pad disposed in the at least one second opening and on the backside dielectric layer; and
at least one second trace connecting the at least one second backside UBM pad to the first backside UBM plane, wherein the first backside UBM plane is electrically connected to the at least one second conductive via through the at least one second backside UBM pad.

3. The semiconductor device as claimed in claim 1, wherein the first conductive vias, the first liner, the at least one second conductive via and the second liner protrude from the backside surface.

4. The semiconductor device as claimed in claim 1, further comprising:
at least one third conductive via disposed in the semiconductor substrate and surrounded by a third liner; and
a second backside UBM plane disposed on the backside dielectric layer and electrically connected to the at least one third conductive via, wherein the second backside UBM plane does not connect the first backside UBM plane.

5. The semiconductor device as claimed in claim 1, further comprising:
a front dielectric layer disposed adjacent to the front surface;
a plurality of first front UBM pads disposed on the front dielectric layer and electrically connected to the first conductive vias; and
a first front UBM plane disposed on the front dielectric layer and electrically connected to the at least one second conductive via, wherein the first front UBM plane has a plurality of through holes, the first front UBM pads are located within the through holes, and a gap is between the first front UBM plane and the first front UBM pads.

6. The semiconductor device as claimed in claim 5, further comprising:
a front passivation disposed on the front surface of the semiconductor substrate and exposing the ends of the first conductive vias and the second conductive via;
a plurality of first front RDLs disposed on the front passivation and electrically connected to the first conductive vias;
at least one second front RDL disposed on the front passivation and electrically connected to the at least one second conductive via, wherein the front dielectric layer is disposed over the first front RDLs, the second front RDL and the front passivation, and the front dielectric layer has a plurality of first openings and at least one second opening to expose parts of the first front RDLs and the second front RDL, respectively, the first front UBM pads are disposed in the first openings; and
at least one second front UBM pad disposed in the at least one second opening and on the front dielectric layer, wherein the first front UBM plane is electrically connected to the at least one second conductive via through the at least one second front UBM pad.

7. The semiconductor device as claimed in claim 1, further comprising one or more wiring layers disposed on the front surface of the semiconductor substrate.

8. The semiconductor device as claimed in claim 1, wherein the first backside UBM plane is a ground plane or a power plane.

9. A semiconductor package, comprising:
a semiconductor device comprising:
a semiconductor substrate having a front surface and a backside surface;

a plurality of first conductive vias disposed in the semiconductor substrate, each of the first conductive vias being surrounded by a first liner;
at least one second conductive via disposed in the semiconductor substrate and surrounded by a second liner;
a backside dielectric layer disposed adjacent to the backside surface;
a plurality of first backside UBM pads disposed on the backside dielectric layer and electrically connected to the first conductive vias; and
a first backside UBM plane disposed on the backside dielectric layer and electrically connected to the at least one second conductive via, wherein the first backside UBM plane has a plurality of through holes, the first backside UBM pads are located within the through holes, and a gap is between the first backside UBM plane and the first backside UBM pads;
a top die disposed on the semiconductor device and having a plurality of top connection elements on a surface thereof, wherein the top connection elements respectively connected to the first backside UBM pads and at least one of the top connection elements is electrically connected to the first backside UBM plane; and
an underfill disposed between the top die and the semiconductor device for protecting the top connection elements.

10. The semiconductor package as claimed in claim 9, further comprising:
a bottom substrate;
a plurality of bottom connection elements connecting the bottom substrate and the semiconductor device; and
a molding compound encapsulating the bottom substrate, the semiconductor device and the top die.

11. The semiconductor package as claimed in claim 9, wherein the semiconductor device further comprises:
a backside passivation disposed on the backside surface of the semiconductor substrate and exposing ends of the first conductive vias and the second conductive via;
a plurality of first backside RDLs disposed on the backside passivation and electrically connected to the first conductive vias;
at least one second backside RDL disposed on the backside passivation and electrically connected to the at least one second conductive via, wherein the backside dielectric layer is disposed over the first backside RDLs, the second backside RDL and the backside passivation, and the backside dielectric layer has a plurality of first openings and at least one second opening to expose parts of the first backside RDLs and the second backside RDL, respectively, the first backside UBM pads are disposed in the first openings;
at least one second backside UBM pad disposed in the at least one second opening and on the backside dielectric layer; and
at least one trace connecting the at least one second backside UBM pad to the first backside UBM plane, wherein the first backside UBM plane is electrically connected to the at least one second conductive via through the at least one second backside UBM pad.

12. The semiconductor package as claimed in claim 9, wherein the first conductive vias, the first liner, the at least one second conductive via and the second liner protrude from the backside surface.

13. The semiconductor package as claimed in claim 9, wherein the semiconductor device further comprises:
at least one third conductive via disposed in the semiconductor substrate and surrounded by a third liner; and
a second backside UBM plane disposed on the backside dielectric layer and electrically connected to the at least one third conductive via, wherein the second backside UBM plane does not connect the first backside UBM plane.

14. The semiconductor package as claimed in claim 9, wherein the semiconductor device further comprises:
a front dielectric layer disposed adjacent to the front surface;
a plurality of first front UBM pads disposed on the front dielectric layer and electrically connected to the first conductive vias; and
a first front UBM plane disposed on the front dielectric layer and electrically connected to the at least one second conductive via, wherein the first front UBM plane has a plurality of through holes, the first front UBM pads are located within the through holes, and a gap is between the first front UBM plane and the first front UBM pads.

15. The semiconductor package as claimed in claim 14, wherein the semiconductor device further comprises:
a front passivation disposed on the front surface of the semiconductor substrate and exposing the ends of the first conductive vias and the second conductive via;
a plurality of first RDLs disposed on the front passivation and electrically connected to the first conductive vias;
at least one second front RDL disposed on the front passivation and electrically connected to the at least one second conductive via, wherein the front dielectric layer is disposed over the first front RDLs, the second front RDL and the front passivation, and the front dielectric layer has a plurality of first openings and at least one second opening to expose parts of the first front RDLs and the second front RDL, respectively, the first front UBM pads are disposed in the first openings; and
at least one second front UBM pad disposed in the at least one second opening and on the front dielectric layer, wherein the first front UBM plane is electrically connected to the at least one second conductive via through the at least one second front UBM pad.

16. The semiconductor package as claimed in claim 9, wherein the semiconductor device further comprises one or more wiring layers disposed on the front surface of the semiconductor substrate.

17. The semiconductor package as claimed in claim 9, wherein the first backside UBM plane is a ground plane or a power plane.

18. A semiconductor device, comprising:
a semiconductor substrate;
a plurality of signal bonding pads disposed adjacent to the semiconductor substrate;
at least one power or ground bonding pad disposed adjacent to the semiconductor substrate;
a first UBM plane disposed adjacent to the semiconductor substrate and electrically connected to the at least one power or ground bonding pad, and the first UBM plane having a plurality of through holes; and
a plurality of first UBM pads respectively located within the through holes and electrically connected to the signal bonding pads, wherein the area of the first UBM plane is larger than that of each of the first UBM pads.

19. The semiconductor device as claimed in claim 18, further comprising:
a passivation disposed adjacent to a surface of the semiconductor substrate;
a plurality of first RDLs disposed on the passivation and electrically connected to the first conductive vias;

at least one second backside RDL disposed on the passivation and electrically connected to the at least one power or ground bonding pad;

a dielectric layer disposed over the first backside RDLs, the second backside RDL and the passivation, the dielectric layer has a plurality of first openings and at least one second opening to expose parts of the first RDLs and the second RDL, respectively, wherein the first UBM pads are disposed in the first openings;

at least one second UBM pad disposed in the at least one second opening and on the dielectric layer; and at least one trace connecting the at least one second UBM pad to the first UBM plane, wherein the first UBM plane is electrically connected to the at least one power or ground bonding pad through the at least one second UBM pad.

* * * * *